(12) United States Patent
Coumou et al.

(10) Patent No.: US 10,536,130 B2
(45) Date of Patent: Jan. 14, 2020

(54) BALANCING RF CIRCUIT AND CONTROL FOR A CROSS-COUPLED SIMO DISTRIBUTION NETWORK

(71) Applicant: MKS Instruments, Inc., Andover, MA (US)

(72) Inventors: David J. Coumou, Webster, NY (US); Dennis M. Brown, Pittsford, NY (US); Jeongseok Jang, Seoul (KR); Jin Huh, Daejeon (KR)

(73) Assignee: MKS Instruments, inc., Andover, MA (US)

( * ) Notice: Subject to any disclaimer, the term of this patent is extended or adjusted under 35 U.S.C. 154(b) by 1 day.

(21) Appl. No.: 16/112,055

(22) Filed: Aug. 24, 2018

(65) Prior Publication Data

US 2019/0068158 A1  Feb. 28, 2019

Related U.S. Application Data

(60) Provisional application No. 62/551,637, filed on Aug. 29, 2017.

(51) Int. Cl.
| | |
|---|---|
| *H03H 7/42* | (2006.01) |
| *H03H 7/46* | (2006.01) |
| *H01J 37/32* | (2006.01) |
| *H01P 5/19* | (2006.01) |
| *H03H 7/48* | (2006.01) |

(52) U.S. Cl.
CPC ......... *H03H 7/42* (2013.01); *H01J 37/32183* (2013.01); *H01P 5/19* (2013.01); *H03H 7/46* (2013.01); *H03H 7/48* (2013.01); *H01J 2237/334* (2013.01); *H01J 2237/3323* (2013.01)

(58) Field of Classification Search
CPC .... H03H 7/42; H03H 7/46; H03H 7/48; H01J 37/32183; H01J 2237/3323; H01J 2237/334; H01P 5/19
USPC .......................................................... 333/4
See application file for complete search history.

(56) References Cited

U.S. PATENT DOCUMENTS

| | | |
|---|---|---|
| 5,175,472 A | 12/1992 | Johnson, Jr. et al. |
| 5,733,511 A | 3/1998 | De Francesco |
| 6,046,594 A | 4/2000 | Mavretic |
| 6,326,584 B1 | 12/2001 | Jewett et al. |
| 6,677,711 B2 | 1/2004 | MacGearailt |
| 6,863,020 B2 | 3/2005 | Mitrovic et al. |
| 6,884,635 B2 | 4/2005 | Parsons |
| 6,962,664 B2 | 11/2005 | Mitrovic |
| 7,042,311 B1 | 5/2006 | Hilliker et al. |
| 7,286,948 B1 | 10/2007 | Shannon et al. |

(Continued)

OTHER PUBLICATIONS

International Search Report and Written Opinion of the International Searching Authority for International Application No. PCT/US2018/048351, dated Jan. 10, 2019.

*Primary Examiner* — Robert J Pascal
*Assistant Examiner* — Kimberly E Glenn
(74) *Attorney, Agent, or Firm* — Harness, Dickey & Pierce, P.L.C.

(57) ABSTRACT

A single input multiple output plasma control system includes a splitter that receives a single input and generates multiple outputs. Each output from the splitter is provided to a load. The splitter includes branch circuits connected between selected splitter outputs. The branch circuits control voltage, current, power, frequency, or phase between each branch to enable controlling a predetermined relationship between the voltage, current, power, impedance, frequency, or phase measured at each load.

32 Claims, 9 Drawing Sheets

(56) References Cited

U.S. PATENT DOCUMENTS

| | | |
|---|---|---|
| 7,323,116 B2 | 1/2008 | Guiney et al. |
| 7,326,581 B2 | 2/2008 | Anderson et al. |
| 7,368,041 B2 | 5/2008 | Krassnitzer |
| 7,452,824 B2 | 11/2008 | Hoffman et al. |
| 7,462,335 B2 | 12/2008 | Liu et al. |
| 7,602,127 B2 | 10/2009 | Coumou |
| 8,110,991 B2 | 2/2012 | Coumou |
| 8,282,983 B1 | 10/2012 | Kapoor et al. |
| 8,395,322 B2 | 3/2013 | Coumou |
| 9,336,995 B2 | 5/2016 | Coumou et al. |
| 2002/0026251 A1 | 2/2002 | Johnson et al. |
| 2007/0252529 A1 | 11/2007 | Belinger |
| 2010/0295472 A1 | 11/2010 | Wibben et al. |
| 2011/0185972 A1 | 8/2011 | Baek et al. |
| 2015/0348854 A1 | 12/2015 | Kapoor et al. |
| 2017/0018926 A1 | 1/2017 | Coumou et al. |

BALANCING RF CIRCUIT AND CONTROL FOR A CROSS-COUPLED SIMO DISTRIBUTION NETWORK

CROSS-REFERENCE TO RELATED APPLICATIONS

This application claims the benefit of U.S. Provisional Application No. 62/551,637, filed on Aug. 29, 2017. The entire disclosure of the above application is incorporated herein by reference.

FIELD

The present disclosure relates to RF systems and to distributing power between multiple power, voltage, or current between multiple outputs.

BACKGROUND

This section provides background information related to the present disclosure which is not necessarily prior art. The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In various plasma-based manufacturing systems, the work pieces are rotated between electrodes or workstations. In some configurations, the workpiece spends equal time at each electrode or work station. Spending equal time at each electrode or workstation accounts for power mismatch between each electrode or workstation, as the workpiece spends equal time at each workstation or electrode. This theoretical equal amount of energy provided by rotating the workpiece through multiple stations for equal periods of time theoretically leads to improved deposition uniformity and increases throughput correspondingly. For example, if a workpiece rotates through four electrodes or workstations, a throughput of 4:1 is provided.

In some plasma-based manufacturing systems, however, power deviations between each electrode or workstation can vary significantly. Significant variation can reduce the desired uniformity theoretically provided by rotating a workpiece through multiple electrodes or workstations.

SUMMARY

This section provides a general summary of the disclosure, and is not a comprehensive disclosure of its full scope or all of its features.

A single input multiple output plasma control system includes a splitter that receives a single input and generates multiple outputs. Each output from the splitter is provided to a load impedance. The splitter includes branch circuits connected between selected splitter outputs. The branch circuits control voltage, current, or power flow between each branch to enable balancing the respective voltage, current, or power applied to each load.

An electrical splitter receives a RF output signal and generates a first RF output and a second RF output to respective a first load and a second load. The electrical splitter includes a first leg providing the first RF output to the first load and a second leg providing the second RF output to the second load. A balancing circuit connected between the first leg and the second leg controls a first value of an electrical parameter associated with one of the first leg or the second leg and a second value of the electrical parameter associated with an other of the first leg or the second leg. The first value and the second value are controlled to a predefined relationship.

A RF system includes a RF power source generating a RF signal. A splitter receives the RF signal and generates a first RF output and a second RF output to respective a first load and a second load. The RF system includes a first leg providing the first RF output to the first load and a second leg providing the second RF output to the second load. A balancing circuit is connected between the first leg and the second leg. The balancing circuit includes at least one component. The at least one component is variable to control a first value of an electrical parameter associated with one of the first leg or the second leg and a second value of an electrical parameter associated with an other of the first leg or the second leg. A controller configured to vary the least one component. The controller controls the at least one component so that the first value and the second value are controlled to a predefined relationship.

A balancing circuit of an electrical splitter receives a RF output signal and generates a first RF output and a second RF output to respective a first load and a second load. A first leg provides the first RF output to the first load, and the second leg provides the second RF output to the second load. The balancing circuit includes at least component connected between the first leg and the second leg. The at least one component is variable to control a first value of an electrical parameter associated with one of the first leg or the second leg and a second value of the electrical parameter associated with an other of the first leg or the second. The first value and the second value are controlled to a predefined relationship.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
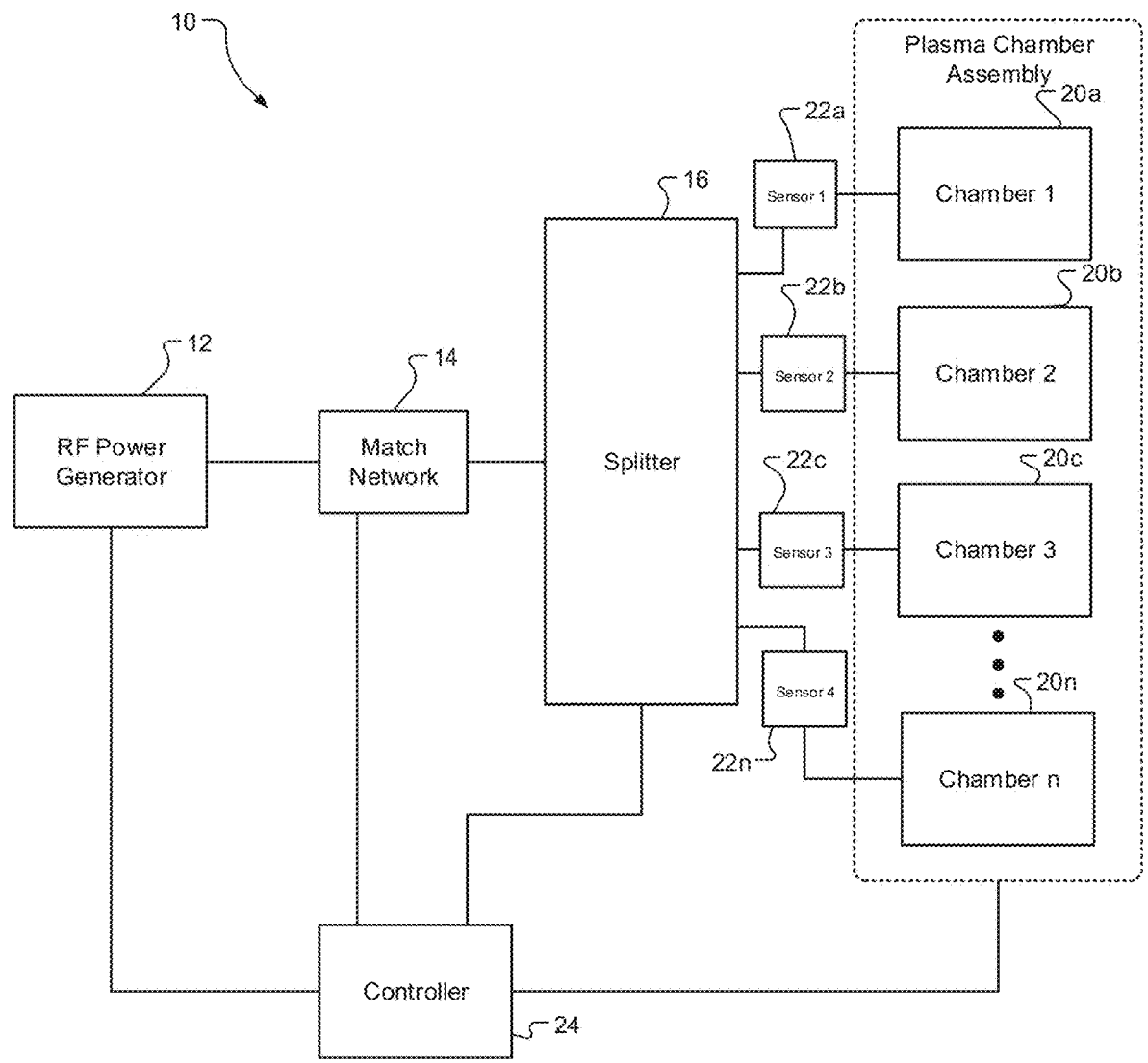
FIG. 1 is a schematic and functional block diagram of an example of a RF power distribution system of the present disclosure.

Example embodiments will now be described more fully with reference to the accompanying drawings.

Plasma etching is frequently used in semiconductor fabrication. In plasma etching, ions are accelerated by an electric field to etch exposed surfaces on a substrate. The electric field is generated based on RF power signals generated by a radio frequency (RF) generator of a RF power system. The RF power signals generated by the RF generator must be precisely controlled to effectively execute plasma etching.

A RF power system may include a RF generator or supply, a matching network, and a load (e.g., a plasma chamber). The RF generator generates RF power signals, which are received at the matching network. The matching network matches an input impedance of the matching network to a characteristic impedance of a transmission line between the RF generator and the matching network. This impedance matching aids in maximizing an amount of power forwarded to the matching network ("forward power") and minimizing an amount of power reflected back from the matching network to the RF generator ("reverse power"). Forward power may be maximized and reverse power may be minimized when the input impedance of the matching network matches the characteristic impedance of the transmission line.

In the RF power generator or supply field, there are typically two approaches to applying the RF signal to the load. A first, more traditional approach is to apply a continuous wave signal to the load. In a continuous wave mode, the continuous wave signal is typically a sinusoidal wave that is output continuously by the power source to the load. In the continuous wave approach, the RF signal may be a sinusoidal output, and the amplitude and/or frequency of the sinusoidal wave can be varied in order to vary the output power applied to the load.

A second approach to applying the RF signal to the load involves pulsing the RF signal, rather than applying a continuous wave signal to the load. In a pulse mode of operation, a RF sinusoidal signal is modulated by a modulation signal in order to define an envelope for the modulated sinusoidal signal. In a conventional pulse modulation scheme, the RF sinusoidal signal typically is output at a predetermined frequency and amplitude. The frequency can be varied to improve impedance match conditions, providing agile frequency tuning. Amplitude may be varied to change the power of the RF signal. Power delivered to the load may also be controlled by varying the modulation signal, in addition to or rather than varying the sinusoidal, RF signal.

In a typical RF power generator configuration, output power applied to the load is determined using sensors that measure the forward and reflected power or the voltage and current of the RF signal applied to the load. Either set of these signals is analyzed to determine the parameters of the power applied to the load. The parameters can include, for example, voltage, current, frequency, and phase. The analysis may determine, for example, a power value which is used to adjust the output of the RF power supply in order to vary the power applied to the load. In a RF power delivery system, where the load is a plasma chamber, the varying impedance of the load causes a corresponding varying power applied to the load, as applied power is partially a function of the impedance of the load. Therefore, the varying impedance can necessitate varying the parameters of the power applied to the load in order to maintain optimum application of power from the RF power supply to the load.

In plasma systems, power is typically delivered in one of two configurations. In a first configuration, the power is capacitively coupled to the plasma chamber. Such systems are referred to as capacitively coupled plasma (CCP) systems. In a second configuration, the power is inductively coupled to the plasma chamber. Such systems are typically referred to as inductively coupled plasma (ICP) systems. Plasma delivery systems typically include a bias and a source that apply respective bias power and source power to one or a plurality of electrodes. The source power typically generates a plasma within the plasma chamber, and the bias power tunes the plasma to an energy relative to the bias RF power supply. The bias and the source may share the same electrode or may use separate electrodes, in accordance with various design considerations.

When a RF power delivery system drives a load in the form of a plasma chamber, the electric field generated by the power delivered to the plasma chamber results in ion energy within the chamber. One characteristic measure of ion energy is the ion energy distribution function (IEDF). The ion energy distribution function (IEDF) can be controlled with a RF waveform. One way of controlling the IEDF for a system in which multiple RF power signals are applied to the load occurs by varying multiple RF signals that are related by frequency and phase. The frequencies between the multiple RF power signals are locked, and the relative phase between the multiple RF signals is also locked. Examples of such systems can be found with reference to U.S. Pat. Nos. 7,602,127; 8,110,991; 8,395,322; and 9,336,995 assigned to the assignee of the present invention and incorporated by reference in this application.

RF plasma processing systems include components for plasma generation and control. One such component is referred to as a plasma chamber or reactor. A typical plasma chamber or reactor utilized in RF plasma processing systems, such as by way of example, for thin-film manufacturing, utilizes a dual frequency system. One frequency (the source) of the dual frequency system controls the generation of the plasma, and the other frequency (the bias) of the dual frequency system controls ion energy. Examples of dual frequency systems include systems that are described in U.S. Pat. Nos. 7,602,127; 8,110,991; 8,395,322; and 9,336,995 referenced above. The dual frequency systems described in the above-referenced patents include a closed-loop control system to adapt RF power supply operation for the purpose of controlling ion density and its corresponding IEDF.

The schematic and functional block diagram of FIG. 1 depicts a balancing and control system 10 for a cross-coupled single input multiple output (SIMO) distribution network. Balancing and control system 10 includes a RF generator 12. RF generator 12 generates a RF signal input to match network 14. Match network 14 varies an impedance between RF generator 12 and plasma chamber assembly 18 so that maximum power is transferred from RF generator 12 to chamber assembly 18. Plasma chamber assembly 18 includes multiple electrodes or chambers 20a, 20b, 20c, . . . , 20n. An electrical splitter 16 is interposed between match network 14 and plasma chamber assembly 18. Splitter 16 receives a RF signal from match network 14 and splits the RF signal for application to each respective chamber of plasma chamber assembly 20a.

Sensors 22a, 22b, 22c, . . . , 22n are placed between splitter 16 and plasma chamber assembly 18. As shown in FIG. 1, each sensor 22a, 22b, . . . , 22n corresponds to a respective plasma chamber or electrode 20a, 20b, . . . , 20n to determine an electrical characteristic value or electrical parameter value associated with a respective electrical characteristic or parameter of a signal output to each respective plasma chamber or electrode. In various portions of the specification, the multiple sensors may be referred to collectively as sensor 22 and the plasma chambers or electrodes may be referred to collectively as plasma chamber or electrode 20.

According to various embodiments, sensor 22 detects operating electrical parameters or characteristics of the RF signals and outputs a value indicative of the same. One skilled in the art will recognize that sensor 22 may be implemented as a voltage, current, and/or directional coupler sensor to detect selected electrical parameter characteristics of the RF signal applied thereto. In various embodiments, sensor 22 may detect (i) voltage v and current i and/or (ii) forward (or source) power PFWD output from splitter 16 and/or reverse (or reflected) power $P_{REV}$ from a respective plasma chamber or electrode. The voltage v, current i, forward power $P_{FWD}$, and reverse power $P_{REV}$ may be scaled and/or filtered versions of the actual voltage, current, forward power, and reverse power associated with the RF signal applied to a respective sensor 22. In various embodiments, sensor 22 may be an analog and/or a digital sensor. In a digital implementation, sensor 22 may include analog-to-digital (A/D) converters and signal sampling components with corresponding sampling rates. In various embodiments sensor 22 may be configured to determine voltage, current, power, or phase of the RF signal applied to chamber 20.

One skilled in the art will recognize that match network 14 can be implemented as a separate component or combined with other components. Further, one skilled in the art will recognize that sensor 22 can be implemented integrally with respective match network 14 or implemented separately from respective match network 14. Further yet, one skilled in the art will recognize that match network 14 and sensor 22 can be configured to be adjacent so that the output from splitter 16 is applied to match network 14 and the output from match network 14 is applied to sensor 22.

Balancing and control system 10 also includes a controller 24. Controller 24 is configured to selectively communicate with one or all of RF power generator 12, match network 14, splitter 16, sensor 22, and chamber 20. In various embodiments controller 24 receives input from the various components and generates control signals to the various components in order to vary the operation of balancing and control system 10.

Figure 2:
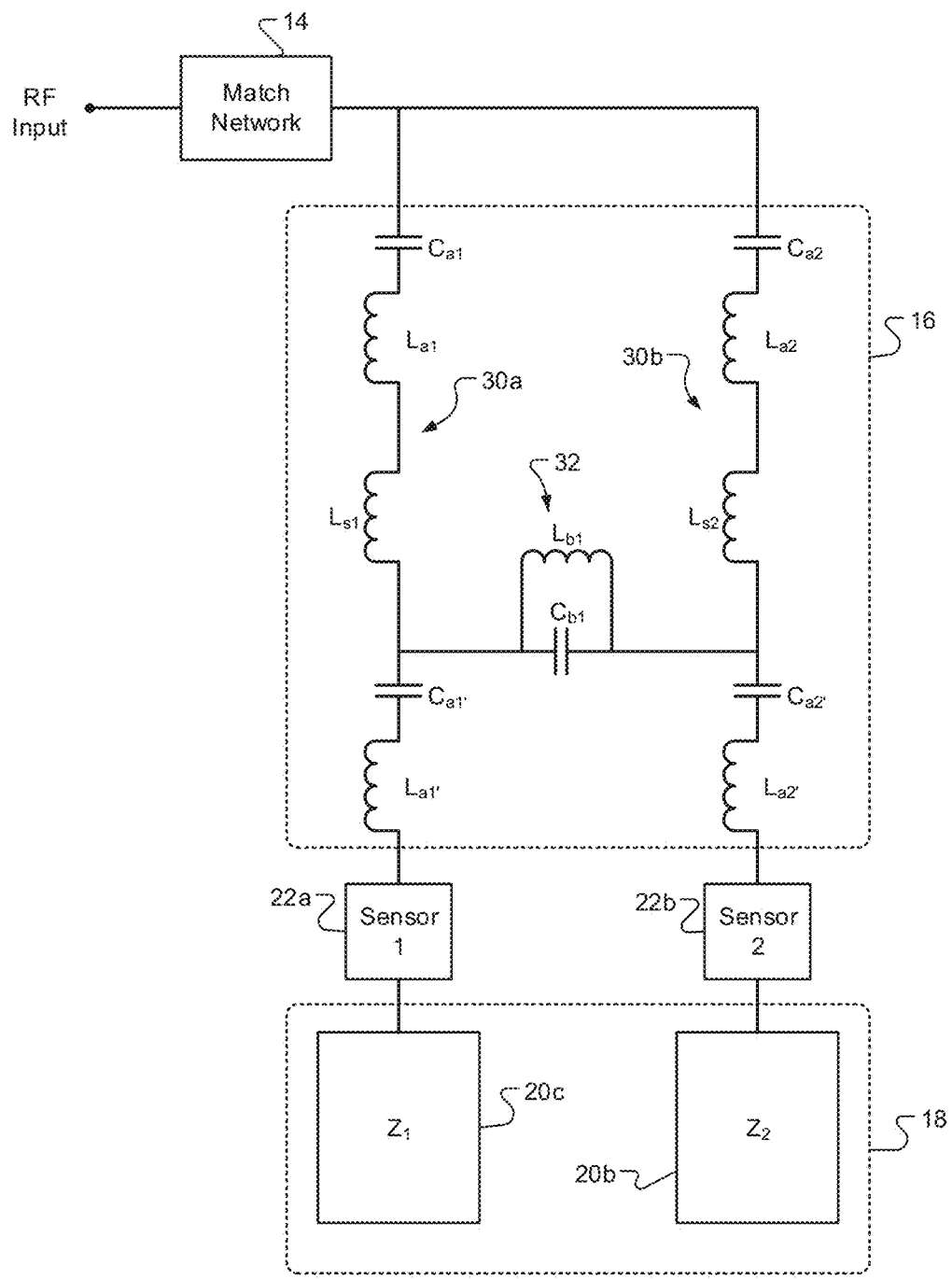
FIG. 2 is a schematic and functional block diagram of an example power distribution system including two outputs.

FIG. 2 depicts an expanded view of splitter 16. Throughout the description, like reference numerals will be used to refer to similar components in the drawings and the specification. FIG. 2 depicts matching network 14 receiving an RF input, such as from RF generator 12, and outputting a matched signal to splitter 16. Splitter 16 in FIG. 2 includes a pair of branches (n=2) which receives the signal output from match network 14 and splits the signal into a pair of signals output to respective sensor 1 22a and sensor 2 22b. Sensor 1 22a and sensor 2 22b output RF signals to respective chamber 1 20a and chamber 2 20b. As shown in FIG. 2, chamber 1 and chamber 2 are represented by respective impedances $Z_1$ and $Z_2$.

Splitter 16 of FIG. 2 shows two branches or legs 30a, 30b, interconnected by a balancing or bridge circuit 32. Leg 30a includes a first LC circuit including inductor $L_{a1}$ and capacitor $C_{a1}$. Inductor $L_{a1}$ connects to a shunt inductor $L_{s1}$. In various embodiments, branch or leg 30a includes a second LC circuit including inductor $L_{a1}'$ and capacitor $C_{a1}'$ connected to an opposite end of shunt inductor $L_{s1}$. In various embodiments, the values of L and C are selected so that the LC circuit resonates at the operating frequency of the RF signal. Thus, in various embodiments, the various LC circuits provide isolation between impedances $Z_1$ and $Z_2$ and RF power generator 12 at frequencies other than the frequency of the RF signal. The magnitude of isolation varies in accordance with the frequency of signal passing though the respective LC circuits. In various other embodiments, selected LC circuits address impedance and bandwidth considerations.

Splitter 16 also includes a balancing or bridge circuit 32. Bridge circuit 32 includes a parallel connected inductor $L_{b1}$ and capacitor $C_{b1}$. In various configurations, bridge circuit 32 controls current, voltage, impedance, or power transfer between branches or legs 30a and 30b. In various other configurations bridge circuit 32 controls phase between branches or legs 30a, 30b. In various embodiments bridge circuit 32 is controlled to vary values of electrical parameters corresponding to respective branches 30a, 30b. The respective values are controlled to a predetermined relationship. The electrical parameters can include voltage, current, power, impedance, frequency, or phase. In this manner, the output from splitter 16 legs or branches 30a, 30b to respective impedances $Z_1$ 20a and $Z_2$ 20b can be varied. Thus, by proper selection of values of inductor $L_{b1}$ and capacitor $C_{b1}$, bridge circuit 32 enables splitter 16 to generate equal power. In various embodiments, one or both of inductor $L_{b1}$ and capacitor $C_{b1}$ can be controlled by controller 24 so that the power output by each leg or branch 30a, 30b of splitter 16 may be controlled dynamically.

Figure 3:
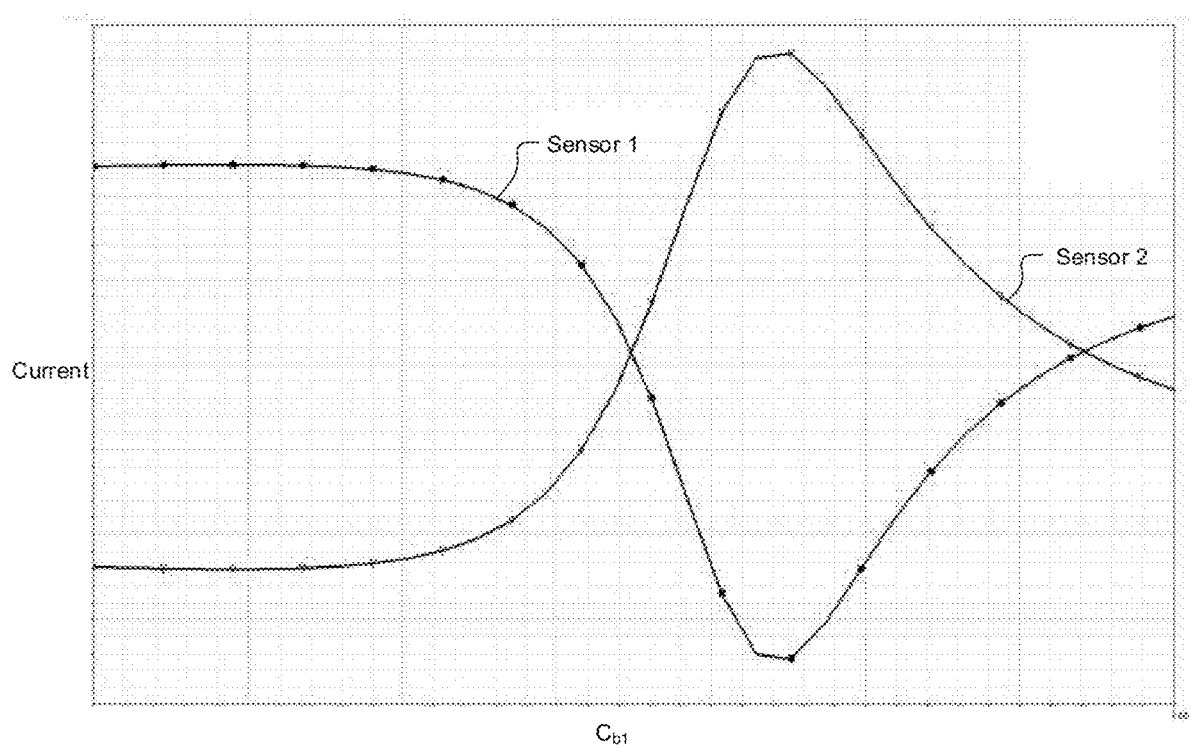
FIG. 3 are example waveforms of the output current of the two outputs of FIG. 2.

Referring to the waveforms in FIG. 3, FIG. 3 depicts a plot of the value of capacitor $C_{b1}$ of bridge circuit 32 and the output current measured by respective sensors 22a, 22b. As can be seen in FIG. 3, changing the value of capacitor $C_{b1}$ causes the current (the respective values of the electrical parameter current in FIG. 3) through respective sensors 22a, 22b to correspondingly change. As can also be seen in FIG. 3, as the value of capacitor $C_{b1}$ changes, an increase in current passing though sensor 2 22b corresponds to a decrease in current through sensor 1 22a, and vice versa. Further, where the waveforms cross, the current through sensor 1 22a and sensor 2 22b is equal. Thus, varying $C_{b1}$ enables varying the relationship between the current measured by respective sensor 1 22a and sensor 2 22b.

Figure 4:
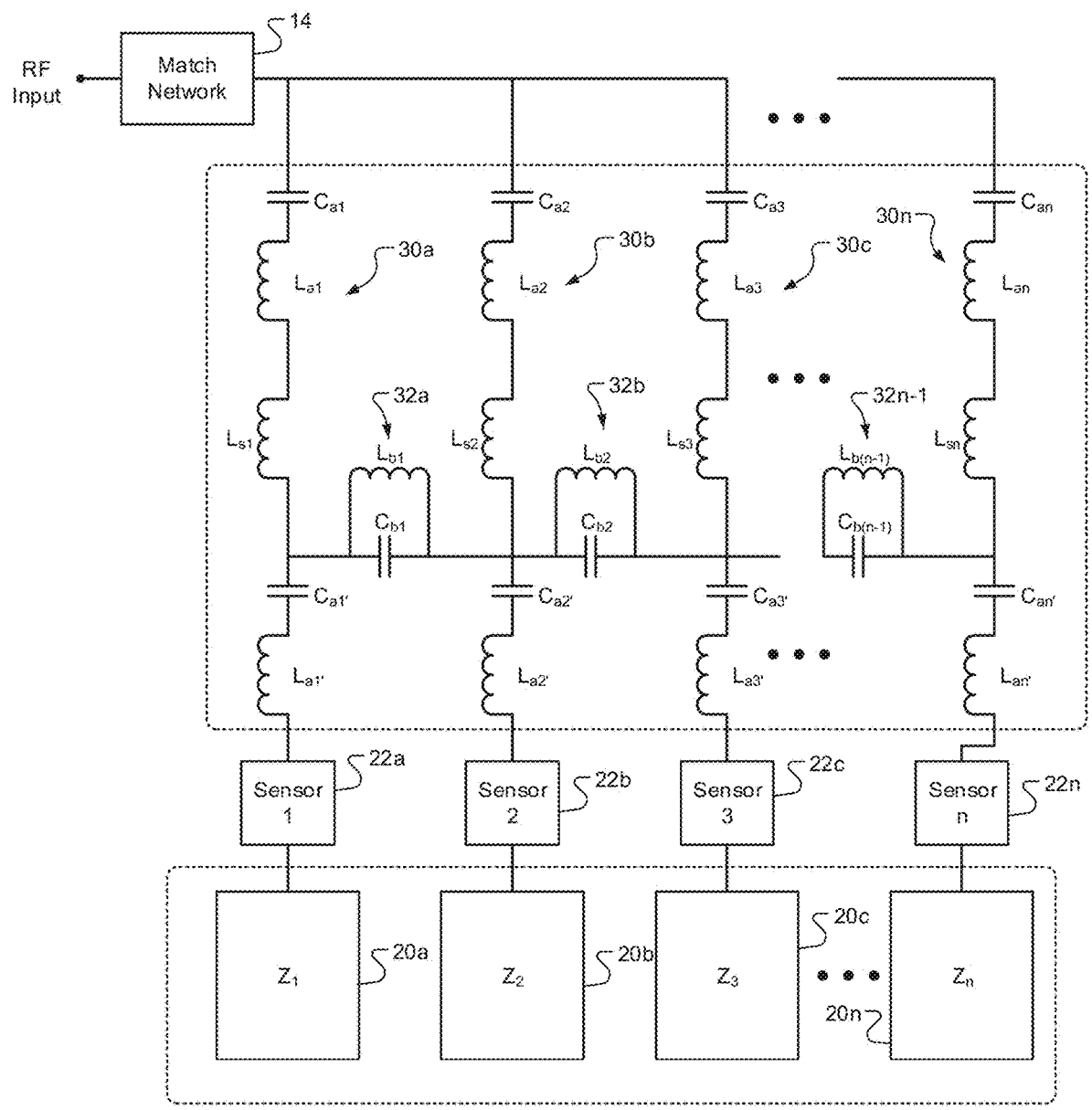
FIG. 4 is a schematic and functional block diagram of an example power distribution system including up to n outputs.

FIG. 4 depicts a generalized view of splitter 16 for n branches or legs 30a, 30b, 30c, . . . , 30n. FIG. 4 depicts matching network 14 receiving an RF input, such as from RF generator 12, and outputting a matched signal to splitter 16. Splitter 16 in FIG. 4 includes n branches which receive the signal output from match network 14 and splits the signal into a n signals output to respective sensors 1, 2, 3, . . . , n (22a, 22b, 22c, . . . , 22n). Sensors 1, 2, 3, . . . , n (22a, 22b, 22c, . . . , 22n) output RF signals to respective chambers 1, 2, 3, . . . , n. As shown in FIG. 4, each chamber is represented by a respective impedance $Z_1$, $Z_2$, $Z_3$, . . . , $Z_n$ (20a, 20b, 20c, . . . , 20n).

Splitter 16 of FIG. 4 shows n branches or legs 30a, 30b, 30c, . . . , 30n interconnected by a respective balancing or bridge circuit 32a, 32b, . . . , 32n-1. In various embodiments, each leg or branch 30a, 30b, 30c, . . . , 30n can be configured with resonant LC circuits as described above with respect to FIG. 2.

Splitter 16 also includes balancing or bridge circuits 32a, 32b, ..., 32n-1. Each bridge circuit 32 32a, 32b, ..., 32n-1 is configured as described above with respect to FIG. 2. In this manner, the output from splitter 16 legs or branches 30a, 30b, 30c, ..., 30n to respective impedances $Z_1$, $Z_2$, $Z_3$, ..., $Z_n$ (20a, 20b, 20c, ..., 20n) can be varied to enable maintaining a predetermined relationship between a value of electrical parameter of each bridge or leg connected by a respective bridge circuit. Thus, by proper selection of values of the inductors and capacitors of bridge circuits, bridge circuits 32a, 32b, ..., 32n-1 enable splitter 16 to generate equal power from each branch or leg. In various embodiments, one or both of the inductors and capacitors of each branch circuit can be controlled by controller 24 so that the power output by each leg or branch 30a, 30b, 30c, ..., 30n-1 of splitter 16 may be controlled dynamically. Each balancing or bridge circuit 32a, 32b, ..., 32n can be controlled as described above with respect to FIG. 2 to enable controlling electrical parameter values in each leg 30a, 30b, ..., 30n to predefined relationships. In various embodiments, a number of predefined relationships can be maintained between values of the electrical parameters of respective legs 30a, 30b, ..., 30n.

Figure 5:
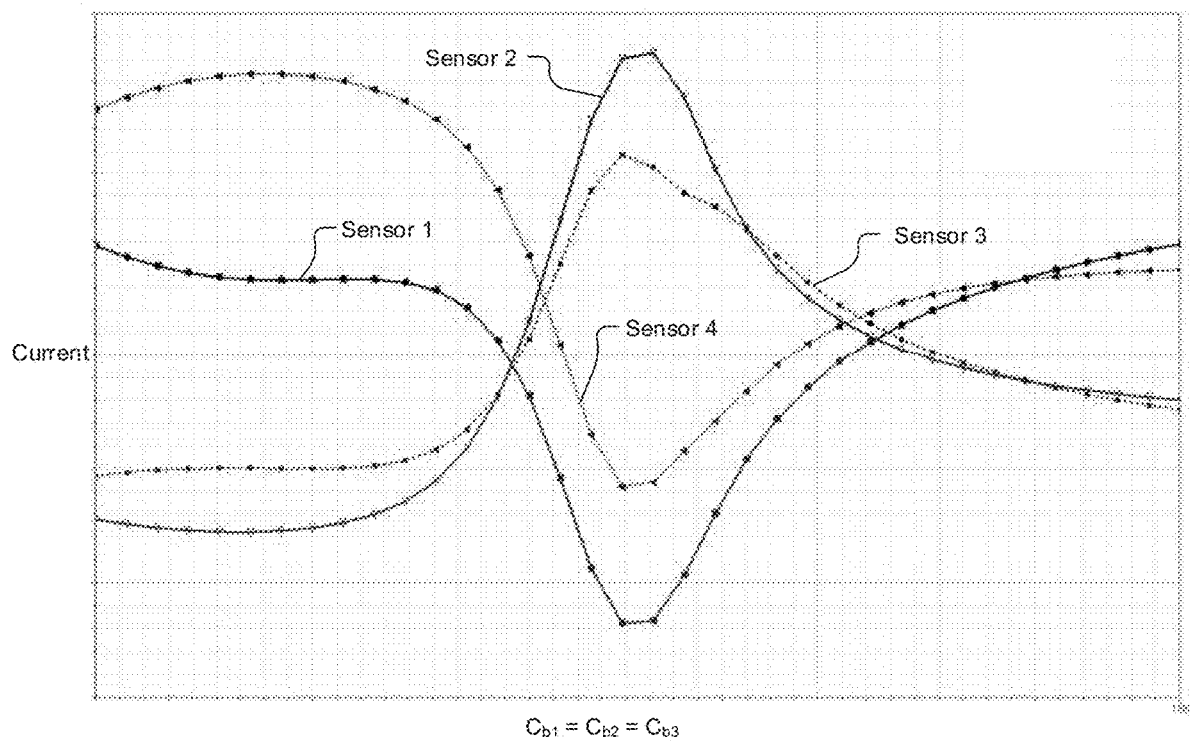
FIG. 5 are example waveforms of the output current of the outputs of FIG. 4 when there are four outputs.

Referring to the waveforms in FIG. 5, FIG. 5 depicts a plot of the value of capacitors $C_{b1}=C_{b1}=C_{b3}$ for n=4 of bridge circuit 32 and the output current measured by respective sensors 22a, 22b, 22c, 22d (the respective values of the electrical parameter current in FIG. 5). As can be seen in FIG. 5, changing the value of capacitors causes the current through respective sensors 22a, 22b, 22c, 22d to correspondingly change. Where the waveforms cross, the current through sensors corresponding to the crossing waveforms is equal. Thus, varying $C_{b1}$, $C_{b2}$, and $C_{b3}$ enables varying the relationship between the currents measured by sensor 1 22a, sensor 2 22b, sensor 3 22c, and sensor 4 22d.

Figure 6:
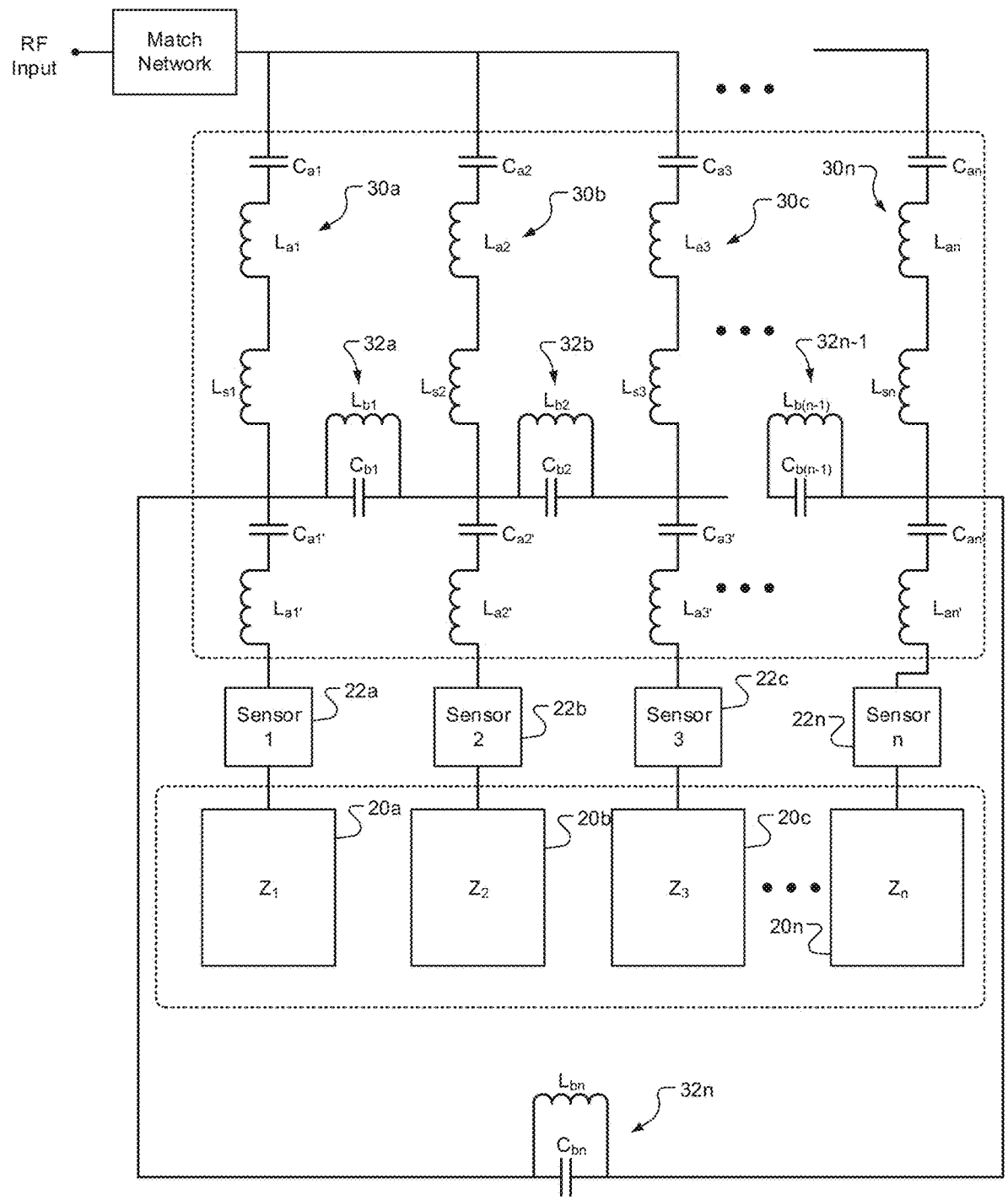
FIG. 6 is a schematic and functional block diagram of an example power distribution system including up to n outputs and n bridge circuits.
Figure 7:
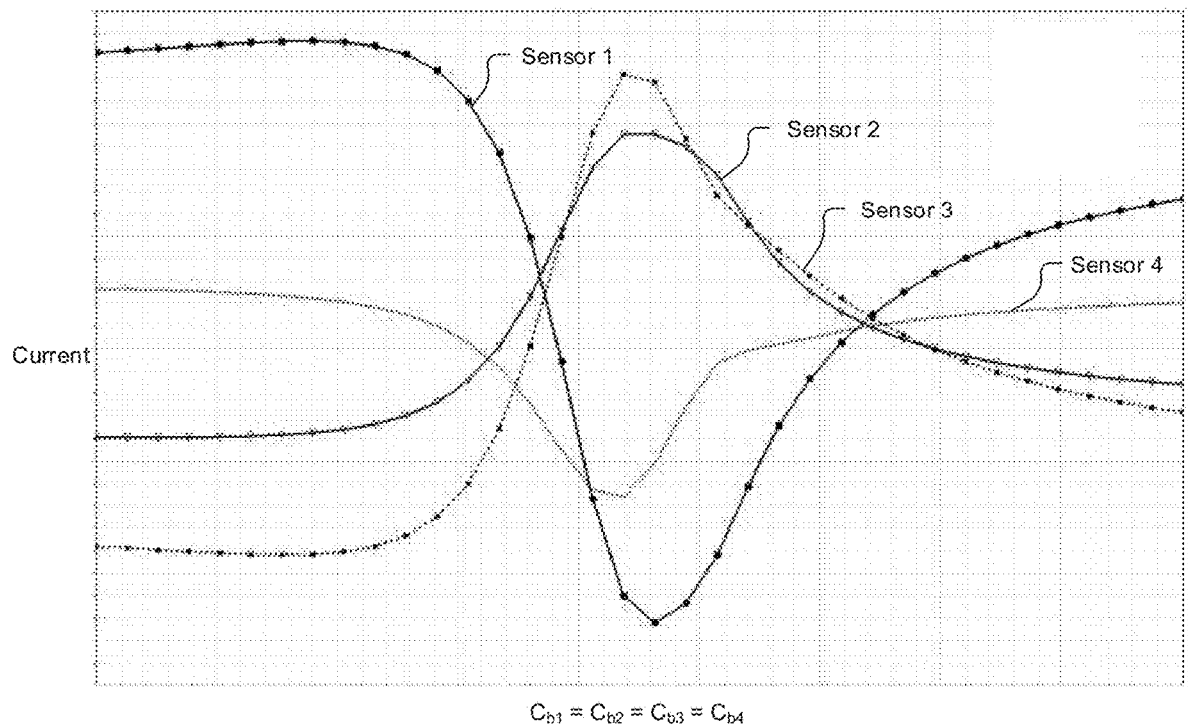
FIG. 7 are example waveforms of the output current of the outputs of FIG. 6 when there are four outputs.

FIG. 6 depicts a configuration similar to FIG. 4, with the addition of a bridge circuit 32n. FIG. 6 operates similarly to FIG. 4 with bridge circuit 32n controlling voltage, current, power, impedance, frequency, or phase between branches 30a and 30n. Referring to the waveforms in FIG. 7, FIG. 7 depicts a plot of the value of capacitors $C_{b1}=C_{b2}=C_{b3}=C_{b4}$ for n=4 for the configuration of FIG. 6. As can be seen in FIG. 7, changing the value of the capacitors causes the current (the respective values of the electrical parameter current in FIG. 7) through respective sensors 22a, 22b, 22c, 22d to correspondingly change. Where the waveforms cross, the current through the sensors is equal. Thus, varying $C_{b1}$, $C_{b2}$, $C_{b3}$, and $C_{b4}$ enables varying the relationship between the currents measured by sensor 1 22a, sensor 2 22b, sensor 3 22c, and sensor 4 22d.

A unified control framework for controlling the chambers of the plasma or chamber assembly 18 includes determining uniform load power among K active plasma chambers on the tool. Active plasma chambers can be determined autonomously by applying a threshold detection level to determine if the corresponding plasma chamber is operating. Alternatively, the plasma chambers that are operating could be indicated to the controller 24 through a digital input or a digital communication interface. From the active chambers, the average load power is computed:

$$E[P_j] = \frac{1}{K}\Sigma_{\forall j} P_j = \frac{1}{K}(P_1 + P_2 + \cdots + P_k) = P_{DA} \quad (1)$$

where,
$E[P_j]$ is the average or mean power,
$P_n$ is the power for the $n^{th}$ chamber, and
$P_{DA}$ is the average power distribution, To obtain uniform power among the active chambers, the difference of the average power to the respective chamber power measurements are minimized by the cost function:

$$\min(\Delta P_j) = P_{DA} - (\alpha_1 P_1 + \alpha_2 P_2 + \ldots \alpha_K P_K) = 0 \quad (2)$$

To find the optimal $\alpha$ coefficent, the cost function is transformed to matrix form, $$\begin{bmatrix} P_{DA} \\ P_{DA} \\ P_{DA} \\ P_{DA} \\ P_{DA} \end{bmatrix} = \begin{bmatrix} |V_1||I_1|\cos(\Theta_1) & 0 & 0 & 0 \\ 0 & |V_2||I_2|\cos(\Theta_2) & 0 & 0 \\ 0 & 0 & |V_3||I_3|\cos(\Theta_3) & 0 \\ 0 & 0 & 0 & |V_4||I_4|\cos(\Theta_4) \\ \frac{1}{K}|V_1||I_1|\cos(\Theta_1) & \frac{1}{K}|V_2||I_2|\cos(\Theta_2) & \frac{1}{K}|V_3||I_3|\cos(\Theta_3) & \frac{1}{K}|V_4||I_4|\cos(\Theta_4) \end{bmatrix} \begin{bmatrix} \alpha_1 \\ \alpha_2 \\ \alpha_3 \\ \alpha_4 \end{bmatrix} \quad (3)$$

Letting $\Lambda$ represent the matrix, we form the matrix equation $P=\Lambda\alpha$. The optimal $\alpha$ is determined by:

$$\alpha = (\Lambda^T \Lambda)^{-1} \Lambda^T P \quad (4)$$

For all active chambers, the $\alpha_j$ is used to determine a new load power set point $p_j(n+1)=\alpha_j p_j(n)$, which is communicated to the respective power delivery system via an analog output signal from the common analysis module or via a digital communication interface. An offset for systematic benefits can be subsequently added to the new load power set point. At periodic intervals, $\alpha$ is recomputed to account for dynamic effects in the plant.

Figure 8:
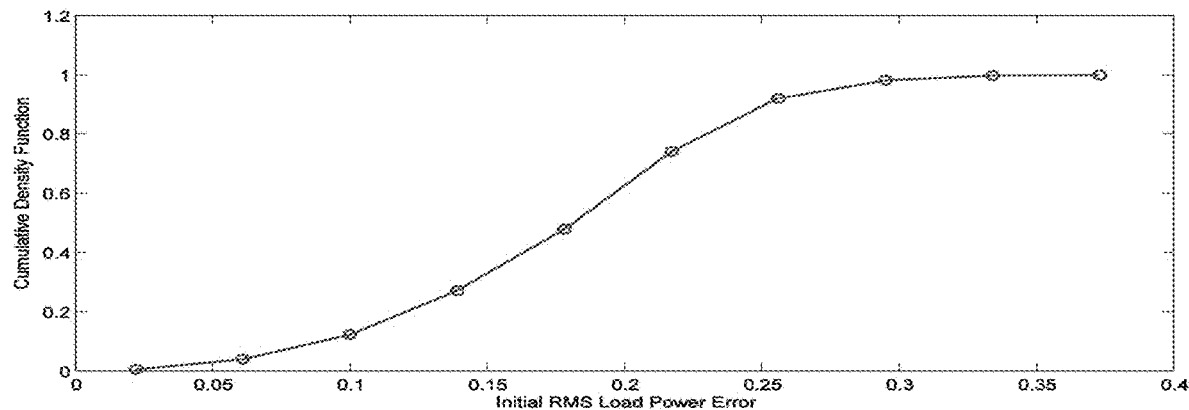
FIG. 8 is an example plot of a cumulative density function relative to an initial load power error.
Figure 9:
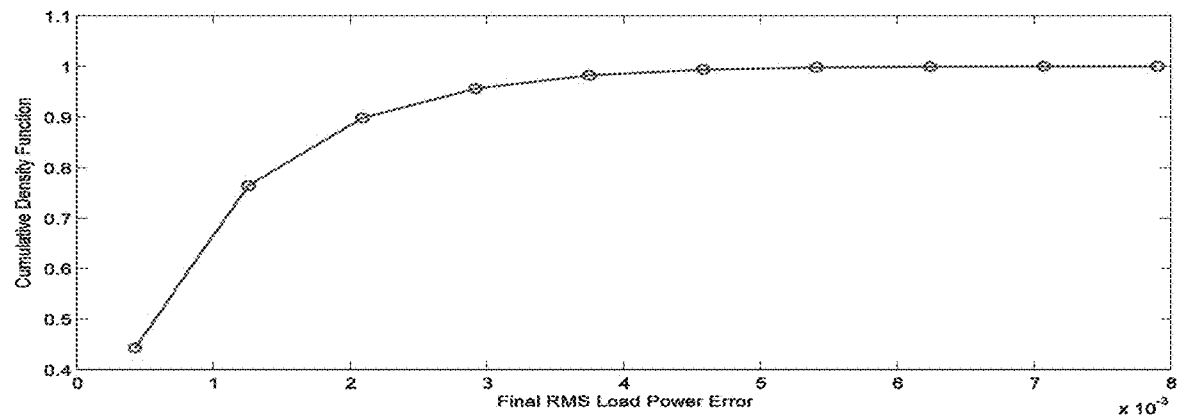
FIG. 9 is an example plot of a cumulative density function relative to a final load power error.

With reference to FIGS. 8 and 9, a Monte Carlo simulation for a dynamic power delivery system and plasma chambers demonstrates the efficacy of the subject disclosure. The cumulative density function for the initial root mean square (RMS) load power error is shown in FIG. 8 as variation from approximately 2.5% to 35%. The final distribution of RMS load power error in FIG. 9 does not exceed 1% and is approximately less than 0.1% RMS error 90% of the time.

An alternative minimization approach is described below. The previous equations describe a cost function that minimizes the difference between an average load power and the load power corresponding to the active chambers. An alternative approach utilizes a cost function that minimizes the electrical parameter (such as load power) difference between the electrical parameter (such as load power) measurements corresponding to the active chambers.

$$\min_{P_{DA}\neq 0}(\Delta P_j) = \sum_{\forall i \neq j}(\alpha_i P_i - \alpha_j P_j) = 0 \quad (5)$$

This corresponds to a set of equations that can be represented in matrix form as $$\begin{bmatrix} 0 \\ 0 \\ 0 \\ 0 \\ 0 \\ 0 \\ P_{DA} \end{bmatrix} = \begin{bmatrix} P_1 & -P_2 & 0 & 0 \\ P_1 & 0 & -P_3 & 0 \\ P_1 & 0 & 0 & -P_4 \\ 0 & P_2 & -P_3 & 0 \\ 0 & P_2 & 0 & -P_4 \\ 0 & 0 & P_3 & -P_4 \\ \frac{1}{K}P_1 & \frac{1}{K}P_2 & \frac{1}{K}P_3 & \frac{1}{K}P_4 \end{bmatrix} \begin{bmatrix} \alpha_1 \\ \alpha_2 \\ \alpha_3 \\ \alpha_4 \end{bmatrix} \quad (6)$$

As previously shown, this has an equivalent form with an optimal α determined by $$\alpha = (\Lambda^T \Lambda)^{-1} \Lambda^T P \quad (7)$$

The coefficient $\alpha_n$ determines the adjustable value of one or both of L or C in bridge circuit 32 to effect control as described herein.

As above, the $\alpha_j$ is used to determine a new electrical parameter set point $p_j(n+1) = \alpha_j p_j(n)$, which is communicated to the respective power delivery system via an analog output signal from the common analysis module, such as controller 24, or via a digital communication interface. The power delivery system then determines adjustments to an offset for systematic benefits can be subsequently added to the new load power set point. At periodic intervals, α is recomputed to account for dynamic effects in the plant.

The matrix form that is used in both minimization methods has a row included as the last entry in the matrix. This is a constraint equation to force the α result to converge to an average load power $P_{DA}$. In various embodiments, this equation could be omitted or modified for other constraints. One possible permutation of the constraint equation could be non-uniform power level where the $K^{-1}$ constant is replaced by weighted values with the requirement the weighted values sum to 1. This yields a predetermined relationship between the electrical parameter values which may be one or both non-uniform and not minimized.

The discussion above used load power as an example of providing unified control. The concept is extendable for the purpose of unified control using a different electrical parameter or variable in lieu of the load power variable in the minimized cost function. These electrical parameter variables could include the measured voltage, current, impedance, frequency, power, or phase. Phase could include the phase difference between voltage and current, or the phase of the measured voltage or the measured current. Further extension may include functions of these variables. These functions could include plasma parameters that are derived from a set of these measured values. For instance, ion mass/flux and plasma density and electron temperature can be determined from the measurements of the common analysis module.

The discussion below describes a generalization of the scheme to control a variety of different measured parameters. Previously described examples relied upon the load power. Load power may be replaced with a general variable $\chi$, indicating an electrical parameter of the other measured values or functions of those values. We commence with our previous cost functions and define them in general terms:

$$\min(\Delta \chi_j) = \xi(\alpha_1 \chi_1 + \alpha_2 \chi_2 + \ldots \alpha_K \chi_K) = 0 \quad (8)$$

$$\text{Min}(\Delta \chi_j) = \Sigma_{\forall i \neq j}(\alpha_i \chi_i - \alpha_j \chi_j) = 0 \quad (9)$$

We note in the first minimization equation that ξ was previously assigned to $P_{DA}$. For the generalized case, ξ may take on an alternate definition in lieu of E[χ]. These cost functions have their respective equivalent matrix form:

$$\begin{bmatrix} \xi_1 \\ \xi_2 \\ \xi_3 \\ \xi_4 \\ \xi_5 \end{bmatrix} = \begin{bmatrix} \chi_1 & 0 & 0 & 0 \\ 0 & \chi_2 & 0 & 0 \\ 0 & 0 & \chi_3 & 0 \\ 0 & 0 & 0 & \chi_4 \\ \frac{1}{K}\chi_1 & \frac{1}{K}\chi_2 & \frac{1}{K}\chi_3 & \frac{1}{K}\chi_4 \end{bmatrix} \begin{bmatrix} \alpha_1 \\ \alpha_2 \\ \alpha_3 \\ \alpha_4 \end{bmatrix} \quad (10)$$

and $$\begin{bmatrix} 0 \\ 0 \\ 0 \\ 0 \\ 0 \\ 0 \\ \xi \end{bmatrix} = \begin{bmatrix} \chi_1 & -\chi_2 & 0 & 0 \\ \chi_1 & 0 & -\chi_3 & 0 \\ \chi_1 & 0 & 0 & -\chi_4 \\ 0 & \chi_2 & -\chi_3 & 0 \\ 0 & \chi_2 & 0 & -\chi_4 \\ 0 & 0 & \chi_3 & -\chi_4 \\ \frac{1}{K}\chi_1 & \frac{1}{K}\chi_2 & \frac{1}{K}\chi_3 & \frac{1}{K}\chi_4 \end{bmatrix} \begin{bmatrix} \alpha_1 \\ \alpha_2 \\ \alpha_3 \\ \alpha_4 \end{bmatrix} \quad (11)$$

As previously shown, this has an equivalent equation with an optimal α determined by:

$$\alpha = (\Lambda^T \Lambda)^{-1} \Lambda^T \xi \quad (12)$$

The $\alpha_j$ is used to determine a new set point:

$$\chi_j(n+1) = \alpha_j \chi_j(n) \quad (13)$$

which is communicated to the respective power delivery system via an analog output signal from the common analysis module or via a digital communication interface. An offset for systematic benefits can be subsequently added to the new set point. At periodic intervals, α is recomputed to account for dynamic effects in the plant.

Figure 10A:
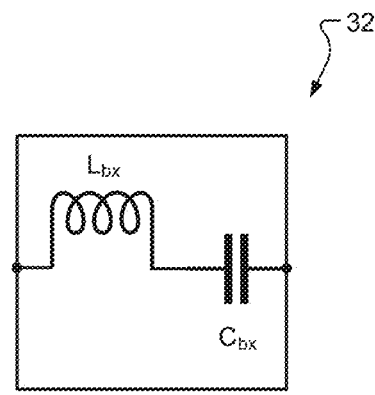
FIGS. 10a-10c are schematic diagrams of various configurations of the bridge circuit described herein.
Figure 10B:
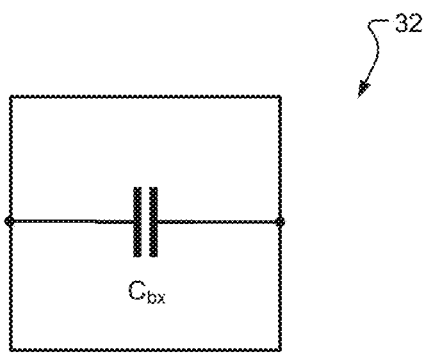
Figure 10C:
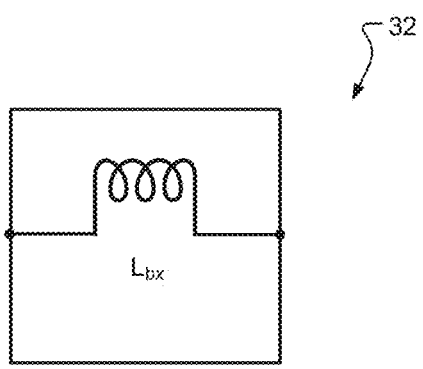

FIGS. 10a-10c indicate various embodiments of balancing or bridge circuit 32. In FIGS. 2, 4, 6, balancing circuit 32 is shown as a parallel LC circuit. FIG. 10a indicates an embodiment of balancing circuit 32 including a series LC circuit. FIG. 10b indicates a balancing circuit 32 implemented as a capacitor. FIG. 10c indicates a balancing circuit 32 implemented as an inductor. These various four configurations of balancing circuit 32 may be selected in accordance with specific design considerations and requirements.

A distribution scheme to balance RF power to various node outputs include when manufacturing multiple targets on a single process tool that contains multiple plasma chambers, the work piece may be exposed to the same amount of power during a uniform processing time for all RF plasma chambers associated with the process tool. The system of the present disclosure allows load sharing between electrodes with a bridging circuit to keep power uniform between electrodes and impedance high for isolation. A single analysis module may be configured to analyze multiple RF sensors to achieve unified control across the entire tool can be accomplished.

The bridge element is derived from a high impedance source through a parallel resonant circuit. One of the elements of the parallel circuit is variable to allow power tuning between electrodes.

Unified control can be accomplished with the uniform delivered power to the active chambers on the tool. Dynamic utilization of the plasma processing tool may not simultaneously use all of the chambers. Because the common analysis module couples to the RF sensors, control can be arbitrated to only those RF plasma chambers that are active on the tool.

The analysis module or controller can provide an actuating signal corresponding to the unified parameter, e.g. delivered power. Similarly, the control signal can be communicated via a digital link, e.g. RS-232, or accomplished through a network scheme via Ethernet.

The controller approach described herein is optimal to converge the distinct active plasma chambers to a minimum load power error The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. An electrical splitter receiving a RF output signal and generating a first RF output and a second RF output to respective a first load and a second load, comprising:
a first leg providing the first RF output to the first load;
a second leg providing the second RF output to the second load; and
a balancing circuit connected between the first leg and the second leg, the balancing circuit controlling a first value of an electrical parameter associated with one of the first leg or the second leg and a second value of the electrical parameter associated with an other of the first leg or the second leg,
wherein the first value and the second value are controlled to a predefined relationship.

2. The electrical splitter of claim 1 wherein the electrical parameter is one of voltage, current, power, impedance, frequency, or phase.

3. The electrical splitter of claim 1 wherein the balancing circuit is shunted between the first leg and the second leg and further comprises at least one of an inductor and a capacitor.

4. The electrical splitter of claim 3 wherein the inductor and capacitor are arranged in parallel.

5. The electrical splitter of claim 4 wherein at least one of the capacitor or inductor are variable and are controlled to vary the relationship between the first value and the second value.

6. The electrical splitter of claim 5 further comprising a controller configured to vary the at least one of the capacitor or inductor in order to vary the relationship between the first value and the second value.

7. The electrical splitter of claim 1 wherein the balancing circuit includes at least one component that is varied in order to adjust the relationship between the first value and the second value.

8. The electrical splitter of claim 1 further comprising a controller configured to vary the relationship in accordance with sense signals that vary in accordance with the first value and the second value, respectively.

9. The electrical splitter of claim 1 wherein the predefined relationship is determined in accordance with minimizing a difference between the first value and the second value in accordance with one of:

$$\min(\Delta \chi_j) = \xi - (\alpha_1 \chi_1 + \alpha_2 \chi_2 + \cdots a_K \chi_K) \text{ or}$$

$$\min(\Delta \chi_j) = \sum_{\forall i \neq j} (\alpha_i \chi_i - \alpha_j \chi_j)$$

where:
i and j refer to one of K legs of the electrical splitter;
$\xi$ is the electrical parameter;
$\alpha_n$ is a coefficient corresponding to an $i^{th}$ leg; and
$\chi_n$ is a sensed value of the electrical parameter corresponding to an $n^{th}$ leg.

10. The electrical splitter of claim 9 wherein a setpoint for the electrical parameter for a $j^{th}$ leg is determined in accordance with:

$$\chi_j(n+1) = \alpha_j \chi_j(n)$$

where:
$\alpha_1$ is the coefficient corresponding to the $j^{th}$ leg, and
$X_j(n)$ is a sensed value of the electrical parameter corresponding to the $j^{th}$ leg during a $n^{th}$ iteration for a current setpoint.

11. The electrical splitter of claim 1 wherein at least one of the first leg and the second leg includes an isolation circuit to isolate the at least one of the first leg and the second leg from the other of the first leg and the second leg, and the isolation circuit includes at least one of an inductor and a capacitor.

12. The electrical splitter of claim 1 wherein the electrical splitter generates a third RF output to a third load, further comprising:
a third leg providing the third RF output to the third load; and
a second balancing circuit connected between a selected one of the first leg or the second leg and the third leg,
wherein the second balancing circuit varies a third value of the electrical parameter and the first value or the second value corresponding to the selected one of the first leg or the second leg, and
wherein the third value and the first value or the second value corresponding to the selected one of the first leg or the second leg are controlled to a second predefined relationship.

13. The electrical splitter of claim 12 further comprising:
a third balancing circuit connected between the other of the selected one of the first leg or the second leg and the third leg,
wherein the third balancing circuit varies the third value and an other of the first value or the second value corresponding to the other of the first leg or the second leg, and
wherein the third value and the other of the first value or the second value corresponding to the other of the selected one of the first leg or the second leg are controlled to a third predefined relationship.

14. The electrical splitter of claim 13 wherein the first, the second, and the third values are controlled to one of equal or different predefined relationships.

15. A RF system comprising:
a RF power source generating a RF signal;
a splitter receiving the RF signal and generating a first RF output and a second RF output to respective a first load and a second load, including:
a first leg providing the first RF output to the first load;
a second leg providing the second RF output to the second load;
a balancing circuit connected between the first leg and the second leg, the balancing circuit including at least one component, wherein the at least one component is variable to control a first value of an electrical parameter associated with one of the first leg or the second leg and a second value of the electrical parameter associated with an other of the first leg or the second leg; and
a controller configured to vary the least one component, wherein the controller controls the at least one component so that the first value and the second value are controlled to a predefined relationship.

16. The RF system of claim 15 wherein the electrical parameter is one of voltage, current, power, impedance, frequency, or phase.

17. The RF system of claim 15 wherein the balancing circuit further comprises at least one of an inductor and a capacitor, and the controller is configured to vary the at least one of the inductor or capacitor to vary a relationship between the first value and the second value.

18. The RF system of claim 17 wherein the inductor and capacitor are arranged in one of a parallel connection or a series connection.

19. The RF system of claim 15 wherein the controller is configured to vary the predefined relationship in accordance with sense signals that vary in accordance with the first value and the second value, respectively.

20. The RF system of claim 15 wherein the predefined relationship is determined in accordance with minimizing a difference between the first value and the second value in accordance with one of:

$$\min(\Delta \chi_j) = \xi - (\alpha_1 \chi_1 + \alpha_2 \chi_2 + \cdots a_K \chi_K) \text{ or}$$

$$\min(\Delta \chi_j) = \sum_{\forall i \neq j} (\alpha_i \chi_i - \alpha_j \chi_j)$$

where:
i and j refer to one of K legs of the splitter;
ξ is the electrical parameter;
$\alpha_n$ is a coefficient corresponding to an $i^{th}$ leg; and
$\chi_n$ is a sensed value of the electrical parameter corresponding to an $n^{th}$ leg.

21. The RF system of claim 20 wherein a setpoint for the electrical parameter for a $j^{th}$ leg is determined in accordance with:

$$\chi_j(n+1) = \alpha_j \chi_j(n)$$

where:
$\alpha_1$ is the coefficient corresponding to the $j^{th}$ leg, and
$X_j(n)$ is a sensed value of the electrical parameter corresponding to the $j^{th}$ leg during a $n^{th}$ iteration for a current setpoint.

22. The RF system of claim 15 wherein at least one of the first leg and the second leg includes an isolation circuit to isolate the at least one of the first leg and the second leg from the other of the first leg and the second leg, and the isolation circuit includes at least one of an inductor and a capacitor.

23. The RF system of claim 15 wherein the splitter generates a third RF output to a third load, further comprising:
a third leg providing the third RF output to the third load; and
a second balancing circuit connected between a selected one of the first leg or the second leg and the third leg,
wherein the second balancing circuit varies a third value of the electrical parameter and the first value or the second value corresponding to the selected one of the first leg or the second leg, and
wherein the third value and the first value or the second value corresponding to the selected one of the first leg or the second leg are controlled to a second predefined relationship.

24. The RF system of claim 23 further comprising:
a third balancing circuit connected between the other of the selected one of the first leg or the second leg and the third leg,
wherein the third balancing circuit varies the third value and an other of the first value or the second value corresponding to the other of the first leg or the second leg, and
wherein the third value and the other of the first value or the second value corresponding to the other of the selected one of the first leg or the second leg are controlled to a third predefined relationship.

25. The RF system of claim 24 wherein the first, the second, and the third values are controlled to one of equal or different predefined relationships.

26. A balancing circuit of an electrical splitter receiving a RF output signal and generating a first RF output and a second RF output to respective a first load and a second load, wherein a first leg provides the first RF output to the first load and a second leg provides the second RF output to the second load, comprising at least one component connected between the first leg and the second leg, wherein the at least one component is variable to control a first value of an electrical parameter associated with one of the first leg or the second leg and a second value of the electrical parameter associated with an other of the first leg or the second, wherein the first value and the second value are controlled to a predefined relationship.

27. The balancing circuit of claim 26 wherein the electrical parameter is one of voltage, current, power, impedance, frequency, or phase.

28. The balancing circuit of claim 26 wherein the balancing circuit further comprises at least one of an inductor and a capacitor, and a respective least one of a inductance or a capacitance is controlled to vary a relationship between the first value and the second value.

29. The balancing circuit of claim 28 wherein the inductor and capacitor are arranged in one of a parallel connection or a series connection.

30. The balancing circuit of claim 26 wherein the at least inductance or capacitance varies the predefined relationship in accordance with sense signals that vary in accordance with the first value and the second value, respectively.

31. The balancing circuit of claim 26 wherein the predefined relationship is determined in accordance with minimizing a difference between the first value and the second value in accordance with one of:

$$\min(\Delta \chi_j) = \xi - (\alpha_1 \chi_1 + \alpha_2 \chi_2 + \cdots a_K \chi_K) \text{ or}$$

$$\min(\Delta \chi_j) = \sum_{\forall i \neq j} (\alpha_i \chi_i - \alpha_j \chi_j)$$

where:
- i and j refer to one of K legs of the splitter;
- $\xi$ is the electrical parameter;
- $\alpha_n$ is a coefficient corresponding to an $i^{th}$ leg; and
- $\chi_n$ is a sensed value of the electrical parameter corresponding to an $n^{th}$ leg.

32. The balancing circuit of claim 31 wherein a setpoint for the electrical parameter for a $j^{th}$ leg is determined in accordance with:

$$\chi_j(n+1) = \alpha_j \chi_j(n)$$

where:
- $\alpha_1$ is the coefficient corresponding to the $j^{th}$ leg, and
- $X_j(n)$ is a sensed value of the electrical parameter corresponding to the $j^{th}$ leg during a $n^{th}$ iteration for a current setpoint.

\* \* \* \* \*